(12) United States Patent
Nakamura

(10) Patent No.: US 7,891,828 B2
(45) Date of Patent: Feb. 22, 2011

(54) ELECTRONIC DEVICE

(75) Inventor: Toshikatsu Nakamura, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/358,087

(22) Filed: Jan. 22, 2009

(65) Prior Publication Data

US 2009/0290358 A1 Nov. 26, 2009

(30) Foreign Application Priority Data

May 26, 2008 (JP) .............................. 2008-137178

(51) Int. Cl.
*G01D 11/28* (2006.01)
*F21V 11/00* (2006.01)
(52) U.S. Cl. .................... 362/23; 362/26; 362/97.3; 362/351; 362/355; 345/173; 200/310; 200/311
(58) Field of Classification Search .................. 362/23, 362/97.1–97.4, 26–27, 351, 355; 345/173, 345/176; 200/310, 311, 312, 313
See application file for complete search history.

(56) References Cited

U.S. PATENT DOCUMENTS

| 5,397,867 A | * | 3/1995 | Demeo | 200/5 A |
| 7,142,189 B2 | * | 11/2006 | Engelmann | 345/102 |
| 2004/0163936 A1 | * | 8/2004 | Clegg et al. | 200/5 A |

FOREIGN PATENT DOCUMENTS

| JP | 09-138398 | 5/1997 |
| JP | 2003-134210 | 5/2003 |
| JP | 2004-198878 | 7/2004 |
| JP | 2006-145682 | 6/2006 |
| JP | 2007-141076 | 6/2007 |
| JP | 2007-305313 | 11/2007 |

OTHER PUBLICATIONS

Japanese patent application No. 2008-137178, Notice of Reason for Rejection, mailed Apr. 14, 2009 (English translation).

* cited by examiner

*Primary Examiner*—Robert J May
(74) *Attorney, Agent, or Firm*—Blakely, Sokoloff, Taylor & Zafman LLP

(57) ABSTRACT

An electronic device includes a housing and a touch sensor mounted in the housing. The touch sensor further includes a translucent panel provided in a part of the housing, a printed circuit board which senses a touch on the translucent panel by a user, a light source mounted to the printed circuit board, which irradiates light towards the translucent panel, and a diffusion sheet provided between the translucent panel and the light source, which diffuses the light irradiated from the light source. The diffusion sheet further includes a first region formed transparent to directly transmit the light, and a second region frosted to diffuse the light towards an outer peripheral portion of the translucent panel. The second region is provided at a position corresponding to the light source, and the first region is provided to surround the second region.

4 Claims, 5 Drawing Sheets

ELECTRONIC DEVICE

CROSS-REFERENCE TO RELATED APPLICATIONS

This application is based upon and claims the benefit of priority from Japanese Patent Application No. 2008-137178, filed May 26, 2008, the entire contents of which are incorporated herein by reference.

BACKGROUND

1. Field

One embodiment of the invention relates to an electronic device equipped with a touch sensor which serves as an operation section to instruct various types of processes.

2. Description of the Related Art

Jpn. Pat. Appln. KOKAI Publication No. 2003-134210 discloses a mobile telephone device in which a wide range of the illuminated portion is lighted by one light emitting diode. This mobile telephone device includes a rear case which makes a part of the outer frame, a illuminated portion made of an opal acryl resin and provided on a part of the rear case, a light-emitting diode which lights the illuminated portion, a printed circuit board having an opening portion, in which the light-emitting diode is mounted, a diffusion sheet provided between the illuminated portion and the light-emitting diode, and a reflection sheet provided to correspond to the opening portion of the printed circuit board. The diffusion sheet is provided to diffuse the light of the light-emitting diode, thereby enhancing the light diffusion effect in the illuminated portion. The reflection sheet is provided at a position opposing the diffusion sheet.

In this mobile telephone, the light-emitting diode emits light when a telephone call is received or a mail is received. Part of the light emitted is diffused by the diffusion sheet and irradiated to the illuminated portion. Further, of the light irradiated from the light-emitting diode, the portion irradiated in the direction along the printed circuit board reflects on the diffusion sheet and is irradiated to the opposite side of the printed circuit board through the opening. This portion of the light reflects on the reflection sheet and transmits the diffusion sheet again through the opening to be irradiated to the illuminated portion. With this structure, the portion of the light leaking in the direction along the printed circuit board can be reflected as well on the diffusion sheet by the reflection board, and thus the light can be efficiently used.

However, the light irradiated in the direction along the printed circuit board is weak from the beginning; therefore when this weak light is reflected on the reflection plate and further diffused by the diffusion sheet, the light in some cases does not reach the surface of the illuminated portion as a practical phenomenon. As a result, the outer circumferential section of the illuminated portion may become dark as an impression to eyes. In order to instantly solve this problem, it is considered to increase the current supplied to the light-emitting diode. However, the increase in the current creates another problem of increasing the power consumption.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic device includes a housing and a touch sensor mounted in the housing. The touch sensor further includes a translucent panel provided in a part of the housing, a printed circuit board which senses a touch on the translucent panel by a user, a light source mounted to the printed circuit board, which irradiates light towards the translucent panel, and a diffusion sheet provided between the translucent panel and the light source, which diffuses the light irradiated from the light source. The diffusion sheet further includes a first region formed transparent to directly transmit the light, and a second region frosted to diffuse the light towards an outer peripheral portion of the translucent panel. The second region is provided at a position corresponding to the light source, and the first region is provided to surround the second region.

The first embodiment of the electronic device will now be described with reference to FIGS. 1 to 4. This embodiment will be described with respect to a portable computer, which is a so-called notebook type personal computer, an example of the electronic device.

Figure 1:
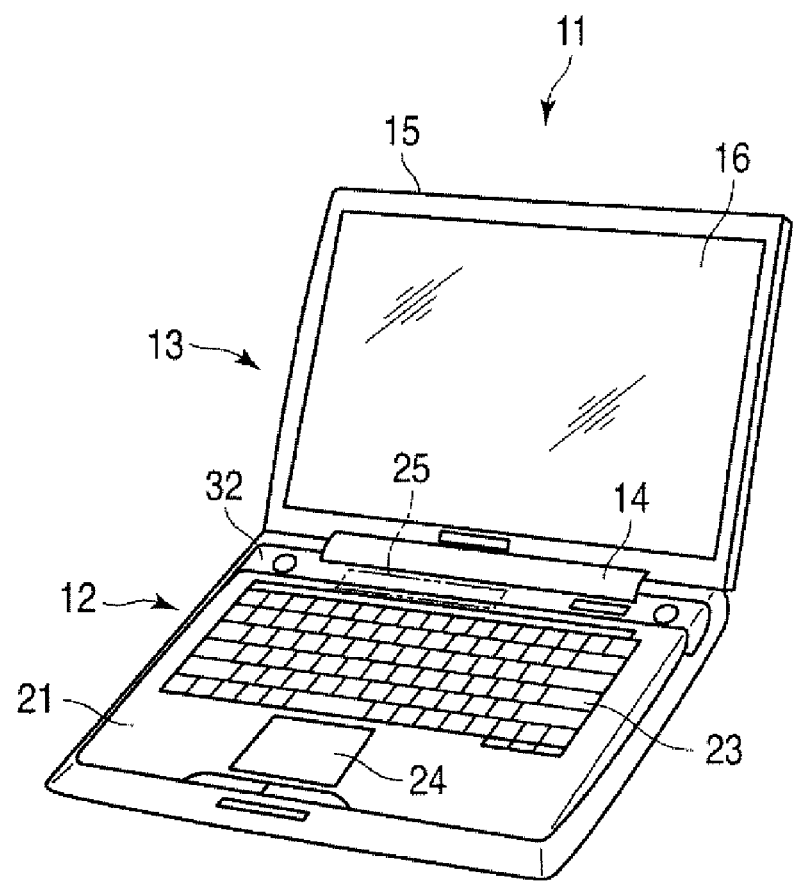
FIG. 1 is an exemplary perspective view showing a portable computer, which is an example of the electronic device according to the first embodiment.

As shown in FIG. 1, a portable computer 11 includes a main body unit 12, a display unit 13 and a hinge portion 14 provided between the main body unit 12 and the display unit 13. The hinge portion 14 supports the display unit 13 so as to be pivotable. The hinge portion 14 supports the display unit 13 so as to be pivotable between a state where the display unit 13 is close to the main body unit 12 and a state where 2 the display unit 13 is open to the main body unit 13.

As can be seen in FIG. 1, the display unit 13 includes a display cabinet 15, and a liquid crystal display 16, which is an example of the display to be housed inside the display cabinet 15.

The main body unit 12 contains a main body cabinet 21 made of a synthetic resin, a first printed circuit board (not shown in the figure) housed inside the main body cabinet 21, a keyboard 23 and a touch pad 24 mounted to the main body cabinet 21, and a touching sensor 25 provided on a part of the main body cabinet 21. The first printed circuit board includes a plurality of circuit components including a CPU. The touch sensor 25 is of a static type which can, for example, detect the change in static capacity to sense a touch with a finger of the user.

Figure 2:
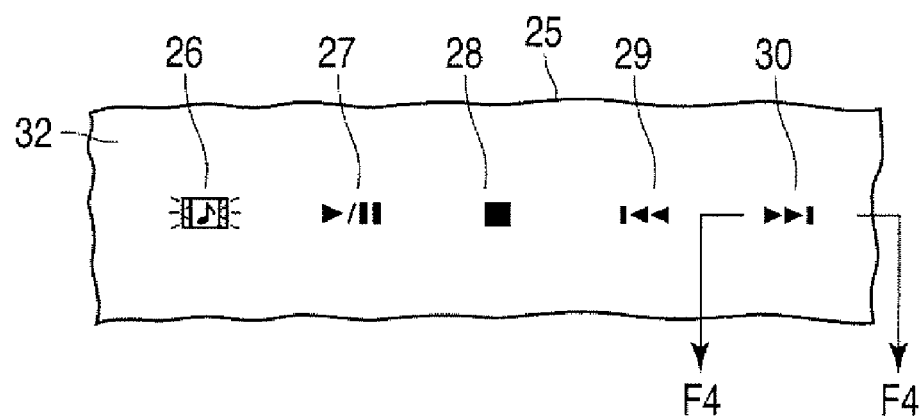
FIG. 2 is an exemplary top view of a touch sensor of the portable computer shown in FIG. 1.
Figure 3:
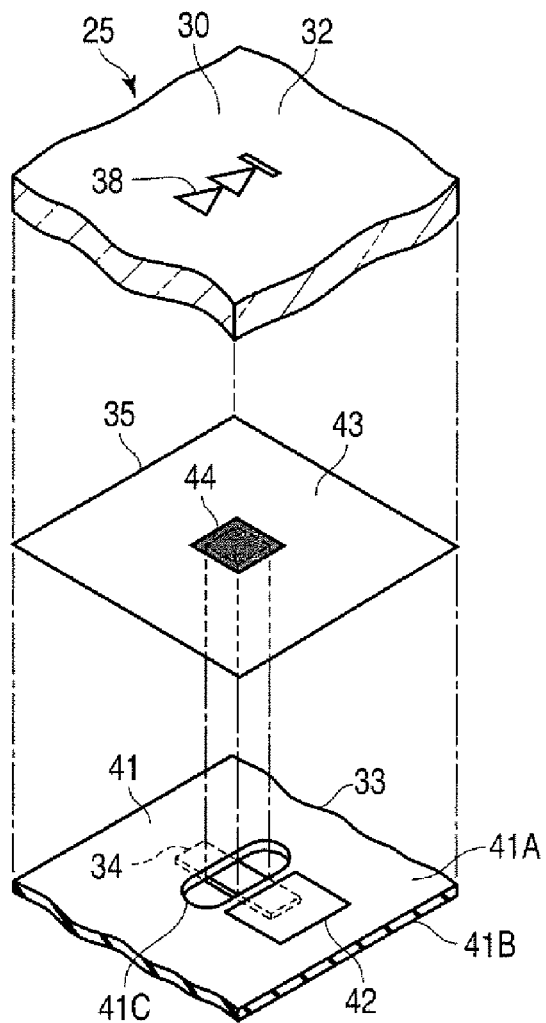
FIG. 3 is an exemplary decomposed perspective view of the touch sensor shown in FIG. 2.

As shown in FIG. 2, the touch sensor 25 contains a start button 26 of, for example, a music player, a play-pause button 27, a stop button 28, a rewind button 29, a fast forward button 30, etc. As shown in FIG. 3, each of the buttons of the touch sensor 25 includes a translucent panel 32 provided at a position back of the main body cabinet 21 further back from the keyboard 23, a second printed circuit board 33 provided underneath the translucent panel 32, a light-emitting diode 34, which is a light source mounted on the second printed circuit board 33, and a diffusion sheet 35 provided between the translucent panel 32 and the light-emitting diode 34. The translucent panel 32 is fixedly fit into the opening of the main body cabinet 21. The translucent panel 32 is made of, for example, a synthetic resin to be semi-transparent in black as a predominant color. It should be noted that the housing referred to in the present invention is of a concept which includes the display cabinet 15 and the main body cabinet 21. Also, note that the light source used for the touch sensor 25 is not limited to the light-emitting diode 34, but it may be, for example, a light bulb.

Figure 4:
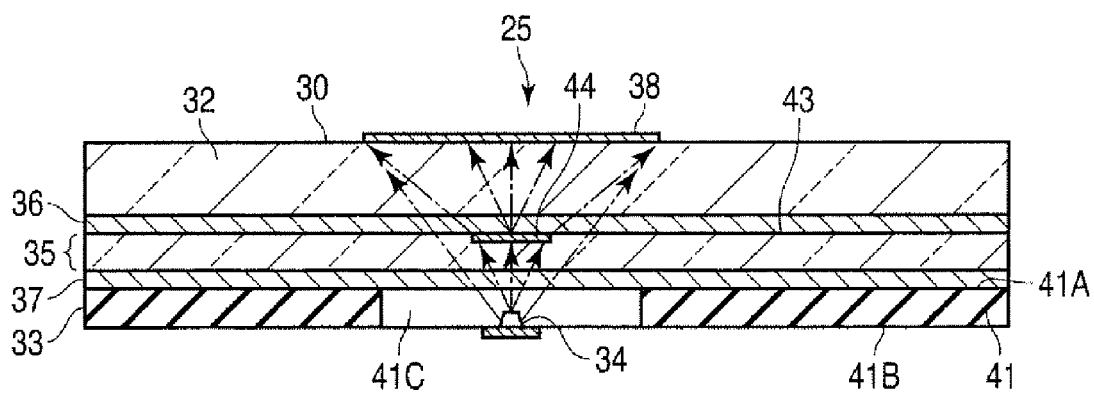
FIG. 4 is an exemplary cross sectional view of the touch sensor shown in FIG. 2, taken along the line F4-F4.

The touch sensor 25 includes, as shown in FIG. 4, a first double-faced tape 36 which adheres the translucent panel 32 and the diffusion sheet 35 to each other and a second double-faced tape 37 which adheres the diffusion sheet 35 and the second printed circuit board 33 to each other. Each of the first double-faced tape 36 and the second double-faced tape 37 has a translucency. The diffusion sheet 35 and the second printed circuit board 33 are adhered to the translucent panel 32 via the first double-faced tape 36 and the second double-faced tape 37. It should be noted that in FIG. 3, the illustration of the first double-faced tape 36 and the second double-faced tape 37 is omitted.

The translucent panel 32 includes a silk print layer 38. The silk print layer 38 is formed of an opaque paint having translucent and light-diffusing properties, which is called silk, to show, for example, characters, figures and symbols.

As shown in FIGS. 3 and 4, the second printed circuit board 33 includes a printed wiring board 41, a touch sensor main body 42 formed on the printed wiring board 41 and a plurality of circuit parts, which are not shown in these figures. The touch sensor main body 42 is formed as, for example, a rectangular conductive pattern (ground) printed on the printed wiring board 41. The touch sensor main body 42 of the second printed circuit board 33 can detect a change in electrostatic capacity which occurs when the finger of the user touches the translucent panel 32.

The printed wiring board 41 includes a first surface 41A opposing the diffusion sheet 35, a second surface 41B provided on an opposite side to the first surface 41A and an opening portion 41C made through the first surface 41A and the second surface 41B. The opening portion 41C is formed to have an elliptic shape. The light-emitting diode 34, which is the light source, is mounted to the second surface 412 such as to overlay on the opening portion 41C.

The diffusion sheet 35 is a film-like material made of a synthetic resin, and it includes a first region 43, which is transparent to transmit light directly, and a second region 44, which is frosted to diffuse light to the surrounding. The second region 44 is provided at a position corresponding to the light-emitting diode 34, which is the light source. More specifically, the second region 44 is formed to be rectangular at a section of the diffusion sheet 35, directly facing the light-emitting diode 34. The second region 44 is formed to be larger than the portion of the light-emitting diode 34 exposing from the opening portion 41C of the printed wiring board 41.

The second region 44 is formed by polishing the surface of the diffusion sheet 35 by, a surface treatment such as sand blasting. In the second region 44, the light irradiated from the light-emitting diode 34 can be diffused towards the outer peripheral portion of the translucent panel 32. The first region 43 is provided around the second region 44.

Next, with reference to FIGS. 3 and 4, the operation of the touch sensor 25 of this embodiment will now be described. In this embodiment, when a finger of the user touches the fast forward button 30 of the translucent panel 32, the change in electrostatic capacitor is detected in the touch sensor main body 42 of the second printed circuit board 33. Thus, it is detected that the finger of the user is touching the translucent panel 32. When the power of the portable computer 11 is ON, the translucent panel 32 is brightly lighted by the light-emitting diode 34. In this state, as shown in FIG. 4, the portion of the light irradiated straightforward to the translucent panel 32 from the light-emitting diode 34 is applied to the second region 44 of the diffusion sheet 35, and further to the silk print layer 38 of the translucent panel 32 as it is diffused by the second region 44. Meanwhile, the portion of the light irradiated towards the peripheral portion of the second region 44 from the light-emitting diode 34 is diffused towards the outer periphery portion of the silk print layer 38 of the translucent panel 32.

Further, the portion of the light irradiated obliquely towards the first region 43 as deviating from the second region 44 directly transmits the diffusion sheet 35, and is applied straight to the silk print layer 38.

According to the first embodiment, the portable computer 11 includes the cabinet and the touch sensor 25 mounted on the cabinet. The touch sensor 25 further includes the translucent panel 32 provided in a part of the cabinet, the print circuit board 33 which senses a touch on the translucent panel 32 by the user, the light source mounted in the printed circuit board 33 and irradiating light towards the translucent panel 32, and the diffusion sheet 35 provided between the translucent panel 32 and the light source, which diffuses the light irradiated from the light source. The diffusion sheet 35 further includes the first region 43 which is made transparent to transmit light directly, and the second region 44 which is frosted to diffuse light towards the outer periphery portion of the translucent panel 34. The second region 44 is provided at a position corresponding to the light source, and the first region 43 is formed to surround the second region 44.

Usually, the portion of the light irradiated from the light-emitting diode 34, which is directed straightly upward from the diode 34 has the strongest intensity, and the light gradually becomes weaker as the direction of the light portion becomes close to the circumference of the light-emitting diode 34. With this structure, the second region 44 of the diffusion sheet 35 is provided at a position corresponding to the light-emitting diode 34, which is the light source, and thus the strong portion of the light irradiated in the straight upward direction from the light-emitting diode 34 can be diffused even to the outer periphery portion of the translucent panel 32. Further, the first region 43 of the diffusion sheet 35 is provided to surround the second region 44. With this structure, the weak portion of the light, which is irradiated obliquely from the light-emitting diode 34, can be applied to the translucent panel 32 without transmitting the second region 44 to diffuse. In this manner, it is possible to prevent such an undesirable event that the weak portion of the light irradiated obliquely towards the outer periphery portion of the translucent panel 32 is diffused by the diffusion sheet 35, thereby making it not possible for the light to reach the surface of the translucent panel 32. Therefore, the outer peripheral portion of the silk print layer 38 of the translucent panel 32 is not darkened and thus the surface of the translucent panel 32 can be evenly illuminated.

In the touch sensor 25 of this embodiment, there is only the diffusion sheet 35 interposed between the translucent panel 32 and the light source, and therefore the space required to install the touch sensor 25 can be made small. Further, there is no need to use a special lens or the like to diffuse light, but merely the use of the diffusion sheet 35 including the frosted second region 44 is sufficient. Therefore, the cost for the production of the portable computer 11 can be suppressed low. As described above, in the case where it is not possible to secure a sufficient distance between the light source and the translucent panel 32 when they are mounted, an electronic device equipped with the touch sensor 25 having a sufficient light diffusion effect can be provided at a lower cost.

In the above-described case, the second region 44 is that provided at a section of the diffusion sheet 35, which directly faces the light source. With this structure, the second region 44 is located at a position directly facing the light-emitting diode 34, which is the light source, and therefore the portion of the light, irradiated in the straight upward direction from the light-emitting diode 34 can be transmitted through the second region 44 of the diffusion sheet 35 to reliably diffuse this portion of the light. On the other hand, the portion of the light, irradiated obliquely from the light-emitting diode 34 in the surrounding direction can be applied directly onto the translucent panel 32 without being diffused by the diffusion sheet 35.

Figure 5:
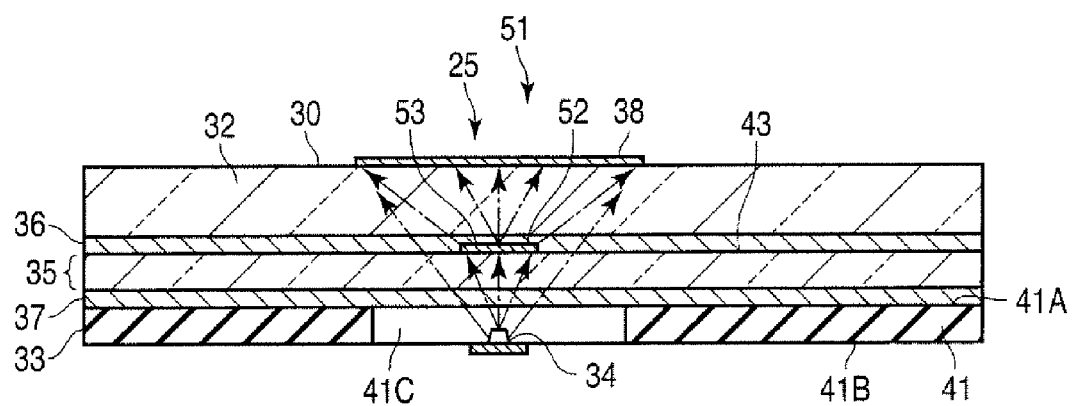
FIG. 5 is an exemplary cross sectional view of a touch sensor of a portable computer according to the second embodiment, taken along a vertical direction thereof.

Next, with reference to FIG. 5, the second embodiment of the electronic device will now be described. A portable computer 51, which is an example of the electronic device of the second embodiment, is different from that of the first embodiment only in the structure of a second region 52 of the diffusion sheet 35, and the other parts are common. Therefore, the following descriptions are made in connection with the part different from that of the first embodiment. Parts common to both embodiments are designated by the same reference numerals, and the descriptions for these parts will be omitted.

The diffusion sheet 35 is a film-like material made of a synthetic resin, and it includes a first region 43, which is transparent to transmit light directly, and a second region 52, which is frosted to diffuse light to the surrounding. The second region 52 is provided at a position corresponding to the light-emitting diode 34, which is the light source, to have the same shape as that of the first embodiment. More specifically, the second region 52 is formed to be rectangular at a section of the diffusion sheet 35, directly facing the light-emitting diode 34. The second region 52 is formed to be larger than the portion of the light-emitting diode 34 exposing from the opening portion 41C of the printed wiring board 41.

The second region 52 is formed of a silk print layer 53, which is prepared by printing, for example, an opaque paint, that is silk, on the diffusion sheet 35. The silk print layer 53 has translucent and light-diffusion properties. The first region 43 is provided to surround the second region 52.

In this embodiment, when the power of the portable computer 51 is ON, the translucent panel 32 is brightly lighted by the light-emitting diode 34. In this state, as shown in FIG. 5, the portion of the light irradiated straightforward to the translucent panel 32 from the light-emitting diode 34 is applied to the second region 52 of the diffusion sheet 35, where the silk print has been made. This portion of light is diffused in the peripheral directions in the second region 52, and irradiated to the silk print layer 38 of the translucent panel 32. Meanwhile, the portion of the light irradiated towards the peripheral portion of the second region 52 from the light-emitting diode 34 is diffused towards the outer periphery portion of the silk print layer 38 of the translucent panel 32.

Further, the portion of the light irradiated from the light-emitting diode 34 obliquely towards the first region 43 as deviating from the second region 52 directly transmits the first region of the diffusion sheet 35, and is applied straight to the outer peripheral portion of the silk print layer 38.

According to the second embodiment, even if the second region 52 is formed in the diffusion sheet 35 by means of the silk print layer 38, the light can be diffused towards the peripheral portion in the second region 52. Therefore, the outer peripheral portion of the silk print layer 38 of the translucent panel 32 is not darkened and thus the entire silk print layer 38 of the translucent panel 32 can be brightly illuminated.

Next, with reference to FIGS. 6 and 7, the third embodiment of the electronic device will now be described. A portable computer 61, which is an example of the electronic device of the third embodiment, is different from that of the first embodiment only in the structure of a diffusion sheet 62, and the other parts are common. Therefore, the following descriptions are made in connection with the part different from that of the first embodiment. Parts common to both embodiments are designated by the same reference numerals, and the descriptions for these parts will be omitted.

The diffusion sheet 62 is a film-like material made of a synthetic resin, and it includes a first region 63, which is transparent to transmit light directly, and a second region 64, which is frosted to diffuse light to the surrounding. The second region 64 is provided in the entire surface of the diffusion sheet 62. The second region 64 is formed by polishing the surface of the diffusion sheet 62 by, a surface treatment such as sand blasting. The first region 63 is formed as a pair of through holes 65 made in the diffusion sheet 62. The through holes 65 are formed in the diffusion sheet 62 at locations adjacent to a position 66 which directly faces the light-emitting diode 34, which is the light source. The pair of through holes 65 are located at respective positions directly facing the opening portion 41C having an elongated hole and made in the printed circuit board 41.

The second printed circuit board 33 includes the printed wiring board 41, the touch sensor main body 42 formed on the printed wiring board 41 and a plurality of circuit parts, which are not shown in these figures. The touch sensor main body 42 is formed as, for example, a rectangular conductive pattern (ground) printed on the printed wiring board 41.

The printed circuit board 41 includes a first surface 41A opposing the diffusion sheet 62, a second surface 41B provided on an opposite side to the first surface 41A and an opening portion 41C made through the first surface 41A and the second surface 41B at a position corresponding to the light-emitting diode 34A, which is the light source. The opening portion 41C is formed to have an elliptic shape. The light-emitting diode 34, which is the light source, is mounted to the second surface 41B such as to overlay on the opening portion 41C.

Figure 6:
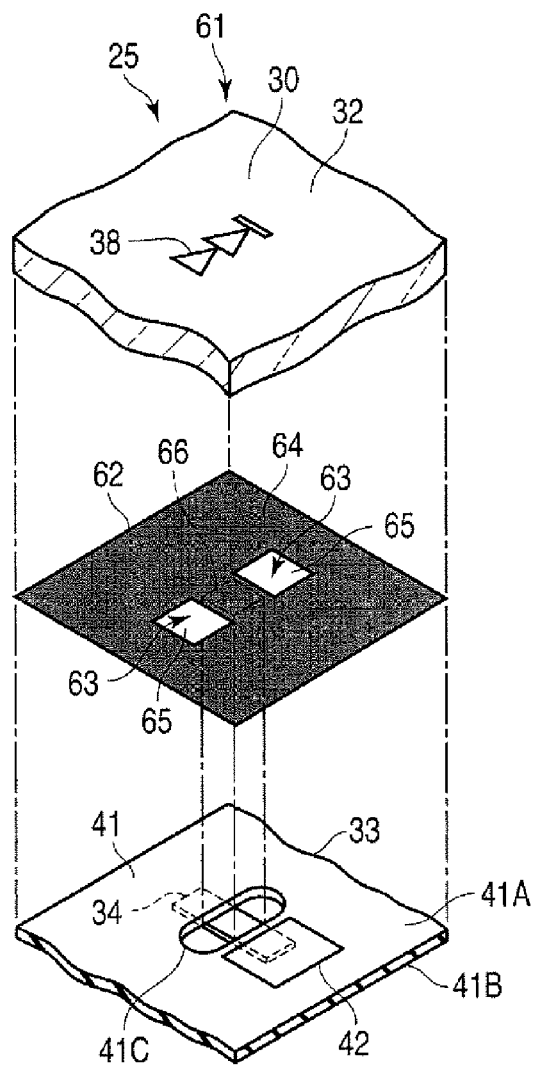
FIG. 6 is an exemplary decomposed perspective view of a touch sensor of a portable computer according to the third embodiment.
Figure 7:
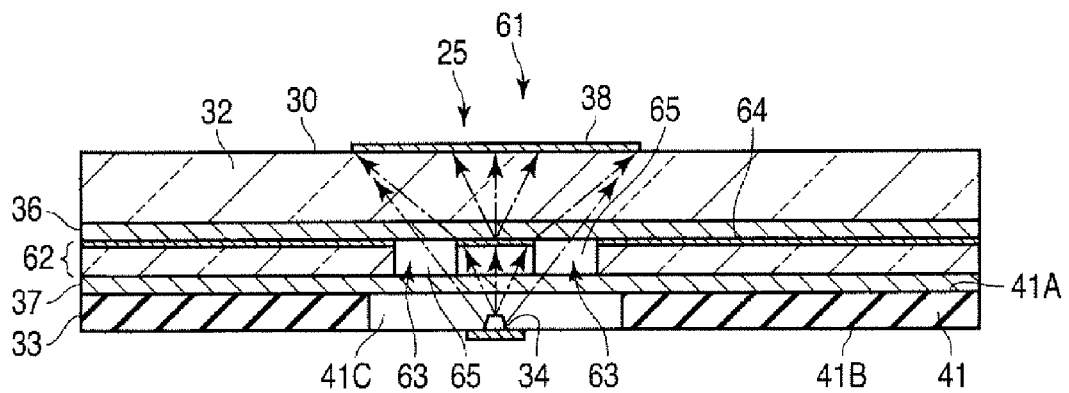
FIG. 7 is an exemplary cross sectional view of the touch sensor shown in FIG. 6, taken along the vertical direction thereof.

As shown in FIGS. 6 and 7, the through hole 65, which forms the first region 63 of the diffusion sheet 62, is located at a position directly facing the opening portion 41C of the printed wiring board 41. It should be noted that in FIG. 6, the illustration of the first double-faced tape 36 and the second double-faced tape 37 is omitted.

When the power of the portable computer 61 is ON, the translucent panel 32 is brightly lighted by the light-emitting diode 34. In this state, as shown in FIG. 7, the portion of the light irradiated straightly upward from the light-emitting diode 34 is applied to the second region 64 of the diffusion sheet 62, and further to the silk print layer 38 of the translucent panel 32 as it is diffused towards the periphery. Meanwhile, the portion of the light irradiated towards the peripheral portion of the diffusion sheet 62 at the position 66 directly facing the light-emitting diode 34 is diffused towards the outer periphery portion of the silk print layer 38 of the translucent panel 32. Further, the portion of the light irradiated from the light-emitting diode 34 obliquely towards the first region 63 as deviating from the second region 64 directly transmits the through hole 65, which is the first region 63, and is applied straight to the silk print layer 38.

According to the third embodiment, the second region 64 is formed in the entire surface of the diffusion sheet 62, and the first region 63 is formed as the through hole 65. Thus, the diffusion sheet 62 can be realized with a simple structure. In particular, according to this embodiment, the first region 63, since it is formed as the through hole 6S, does not further weaken the portion of the light passing through the first region 63, and the translucent panel 32 can be evenly illuminated from the central portion of the silk print layer 38 to the outer peripheral portion.

In this embodiment, the printed circuit board 33 includes a first surface 41A opposing the diffusion sheet 62, a second surface 41B provided on an opposite side to the first surface 41A and having the light source, and an opening portion 41C made through the first surface 41A and the second surface 41B at a position corresponding to the light source. Further, the through hole 65 is located at a position directly facing the opening portion 41C. With this arrangement, the light emitted from the light source mounted on the second surface 41B is irradiated towards the first surface 41A through the opening portion 41C. That is, the light from the light source is irradiated towards the translucent panel 32 while being diffused in accordance with the shape of the opening portion 41C. Here, when the through hole 65 is formed to directly face the opening portion 41C, the portion of the light diffused by the opening 41C, and having a low intensity is guided into the through hole 65 to reach the translucent panel 32 without further weakening the low-intensity light. In this manner, the silk print layer 38 on the translucent panel 32 can be evenly illuminated.

Figure 8:
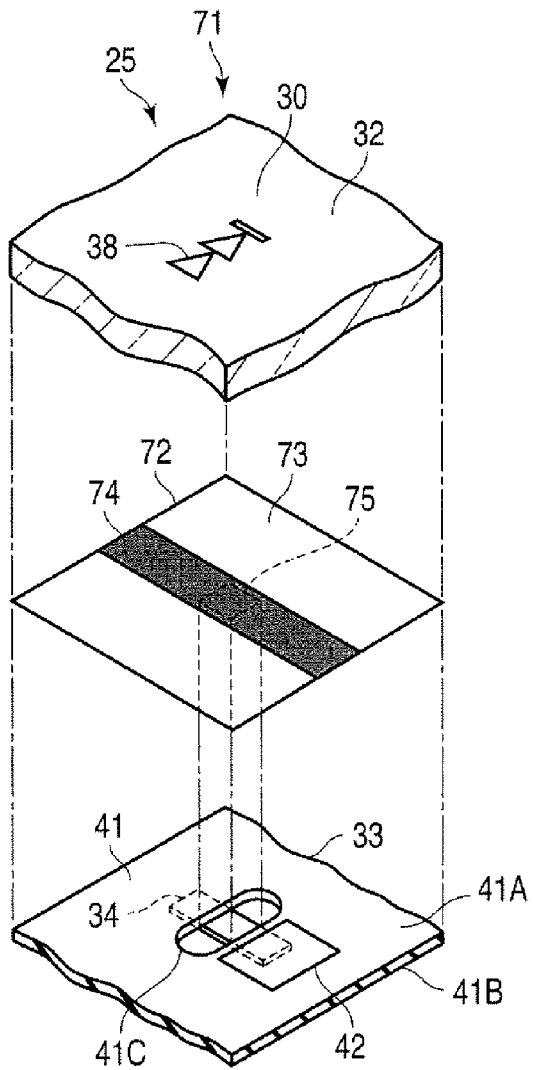
FIG. 8 is an exemplary decomposed perspective view of a touch sensor of a portable computer according to the fourth embodiment.

Next, with reference to FIG. 8, the fourth embodiment of the electronic device will now be described. A portable computer 71, which is an example of the electronic device of the fourth embodiment, is different from that of the first embodiment only in the structure of a diffusion sheet 72, and the other parts are common. Therefore, the following descriptions are made in connection with the part different from that of the first embodiment. Parts common to both embodiments are designated by the same reference numerals, and the descriptions for these parts will be omitted.

The diffusion sheet 72 is a film-like material made of a synthetic resin, and it includes a first region 73, which is transparent to transmit light directly, and a second region 74, which is frosted to diffuse light to the surrounding. The second region 74 is provided at a position corresponding to the light-emitting diode 34, which is the light source. More specifically, the second region 74 is formed as a belt-like region including a section 75 of the diffusion sheet 72, which directly faces the light source. The second region 74 is formed by polishing the surface of the diffusion sheet 72 by a surface treatment such as sand blasting. The first region 73 is formed to surround the second region 74. It should be noted that in FIG. 8, the illustration of the first double-faced tape 36 and the second double-faced tape 37 is omitted.

In the fourth embodiment, when the power of the portable computer 71 is ON, the translucent panel 32 is brightly lighted by the light-emitting diode 34. Here, the portion of the light irradiated straightly upward from the light-emitting diode 34 is applied to the second region 74 of the diffusion sheet 72, and also diffused towards its periphery to be irradiated onto the silk print layer 38 of the translucent panel 32. Meanwhile, the portion of the light irradiated towards the peripheral portion of the second region 74 of the diffusion sheet 72 from the light-emitting diode 34 is irradiated onto the silk print layer 38 while being diffused towards the outer peripheral portion of the silk print layer 38 of the translucent panel 32. Further, the portion of the light irradiated obliquely towards the first region 73 as deviating from the second region 74 directly transmits the first region 73, and is applied straight to the outer periphery portion of the silk print layer 38.

According to the fourth embodiment, the second region 74 of the diffusion sheet 72 is a belt-like region including the section 75 of the diffusion sheet 72, which directly faces the light source. With this structure, it suffices if the second region 74 is formed to have a belt-like shape, and therefore the severity of the processing accuracy required for the surface treatment, for example, sand-blasting of the diffusion sheet 72 can be relaxed as compared to the case of the first embodiment. In this manner, the processability of the diffusion sheet 72 can be improved.

Figure 9:
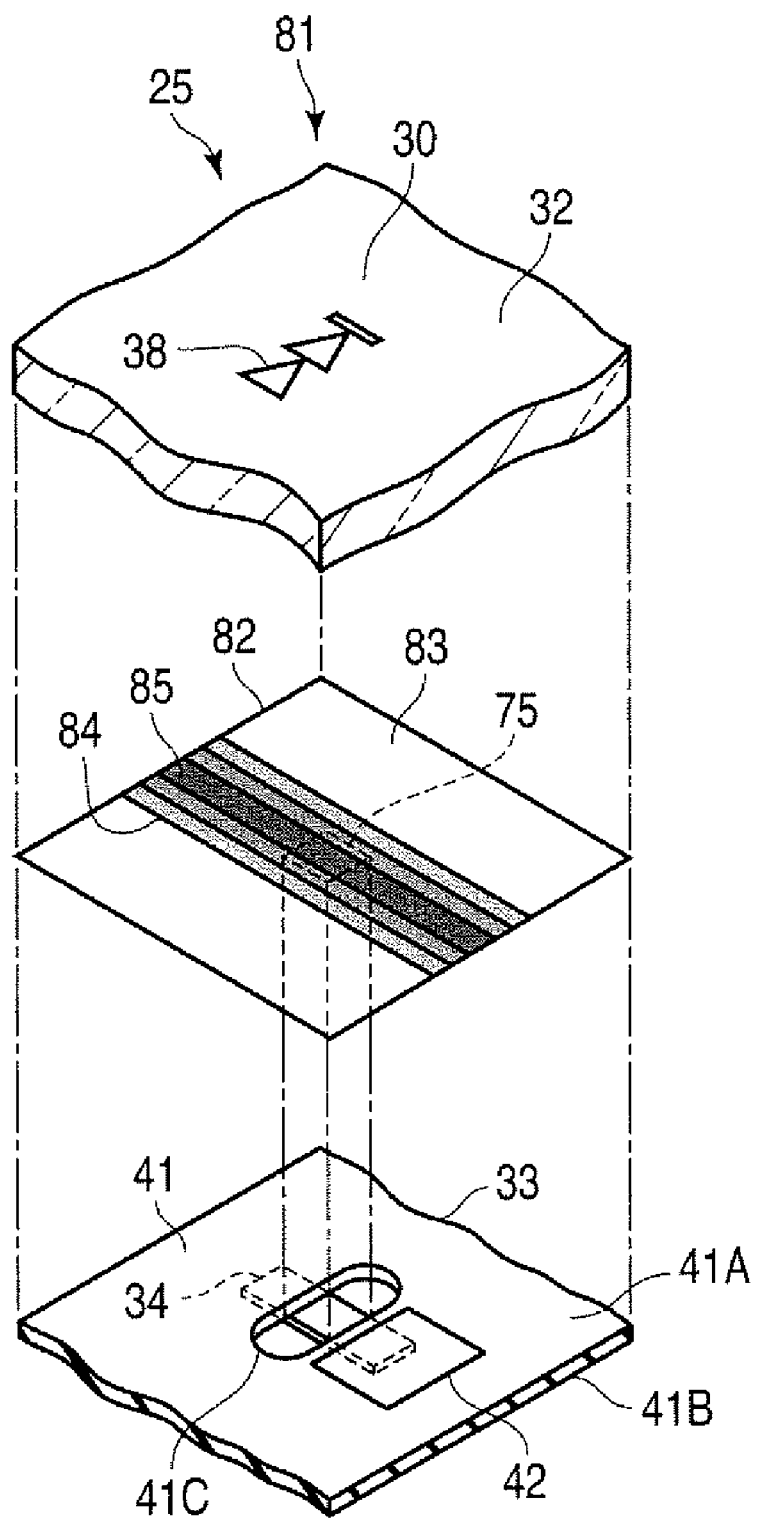
FIG. 9 is an exemplary decomposed perspective view of a touch sensor of a portable computer according to the fifth embodiment.

Next, with reference to FIG. 9, the fifth embodiment of the electronic device will now be described. A portable computer 81, which is an example of the electronic device of the fifth embodiment, is different from that of the first embodiment only in the structure of a diffusion sheet 82, and the other parts are common. Therefore, the following descriptions are made in connection with the part different from that of the first embodiment. Parts common to both embodiments are designated by the same reference numerals, and the descriptions for these parts will be omitted.

The diffusion sheet 82 is a film-like material made of a synthetic resin, and it includes a first region 83, which is transparent to transmit light directly, and a second region 84, which is frosted to diffuse light to the surrounding. The second region 84 is provided at a position corresponding to the light-emitting diode 34, which is the light source. More specifically, the second region 84 is formed as a belt-like region including a section 75 of the diffusion sheet 82, which directly faces the light source. The second region 84 is formed to have a gradation so that the degree of cloudiness varies from one position to another. More specifically, the second region 84 is formed to have such a gradation that the degree of cloudiness increases towards its central portion 85. The second region 84 is formed by polishing the surface of the diffusion sheet 82 by a surface treatment such as sand blasting. The first region 83 is formed to surround the second region 84. It should be noted that in FIG. 9, the illustration of the first double-faced tape 36 and the second double-faced tape 37 is omitted.

In the fourth embodiment, when the power of the portable computer 81 is ON, the translucent panel 32 is brightly lighted by the light-emitting diode 34. Here, the portion of the light irradiated straightly upward from the light-emitting diode 34 is applied to the second region 84 of the diffusion sheet 82, and also diffused towards its periphery to be irradiated onto the silk print layer 38 of the translucent panel 32. Meanwhile, the portion of the light irradiated towards the peripheral portion of the second region 84 from the light-emitting diode 34 is irradiated onto the silk print layer 38 while being diffused towards the outer peripheral portion of the silk print layer 38 of the translucent panel 32. Here, the peripheral portion of the second region 84 has a lower degree of cloudiness, and therefore the amount of light diffused in this section is small.

Further, the portion of the light irradiated obliquely towards the first region 83 as deviating from the second region 84 directly transmits the first region 83, and is applied straight onto the silk print layer 38.

According to the fifth embodiment, in the second region 84, the degree of cloudiness increases towards the central portion 85. Here, when light is subjected to a diffusion process, it creates in some cases a difference in intensity between the light subjected to the diffusion process and light not subjected to the diffusion process. With the above-described structure, in the case where there is a difference in light intensity (brightness) created between the portion of light which has been subjected to the diffusion process in the second region 84 and the portion of light which has directly passed through the first region 83, the difference in the light intensity can be decreased. More specifically, the portion of the light, irradiated in the straight upward direction from the light-emitting diode 34, which is the light source, can be diffused to a wide range above the translucent panel 32. On the other hand, the portion of the light, having a middle degree of light intensity, and irradiated obliquely towards the peripheral portion of the second region 84 can be diffused to a narrow range above the translucent panel 32. Further, the portion of light, having a low intensity and irradiated onto the first region 83 can be irradiated onto the translucent panel 32 without applying the diffusion process thereto. In this manner, the silk print layer 38 on the translucent panel 32 can be illuminated evenly.

The electronic device of the present invention is not limited to the above-provided embodiments. For example, in each of the embodiments, the touch sensor 25 is provided in the main body cabinet 21, but it is alternatively possible to provide the touch sensor 25 in the display cabinet 15. Further, the electronic device of the present invention can be applied not only portable computers but also to mobile telephones. Furthermore, naturally, the electronic device of the present invention can be remodeled into various versions as long as it does not fall out of the scope of the invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
a housing; and
a touch sensor mounted in a part of the housing, wherein the touch sensor further comprising:
a translucent panel including a part indicating at least one of character, pattern and symbol;
a printed circuit board which senses a touch on the translucent panel by a user;
a light emitting diode mounted in the printed circuit board at a position directly opposing the part indicating said at least one of character, pattern and symbol, which irradiates light towards the translucent panel; and
a diffusion sheet provided between the translucent panel and the light emitting diode, which diffuses the light irradiated from the light emitting diode, the diffusion sheet further comprising:
a first region formed transparent to directly transmit the light; and
a second region frosted to diffuse the light towards an outer peripheral portion of the part indicating said at least one of character, pattern and symbol of the translucent panel, wherein
the first region being provided to surround the second region, and
the second region is a region provided at a section of the diffusion sheet, which directly faces the light emitting diode, closer to a center of the part indicating said at least one of character, pattern and symbol with respect to a virtual pyramid defined by line segments connecting the outer peripheral portions of the part indicating said at least one of character, pattern and symbol and the light emitting diode to each other.

2. An electronic device comprising:
a housing; and
a touch sensor mounted in a part of the housing, wherein the touch sensor further comprising:
a translucent panel including a part indicating at least one of character, pattern and symbol;
a printed circuit board which senses a touch on the translucent panel by a user;
a light emitting diode mounted in the printed circuit board at a position directly opposing the part indicating said at least one of character, pattern and symbol, which irradiates light towards the translucent panel; and
a diffusion sheet provided between the translucent panel and the light emitting diode, which diffuses the light irradiated from the light emitting diode, the diffusion sheet further comprising:
a first region formed transparent to directly transmit the light; and
a second region frosted to diffuse the light towards an outer peripheral portion of the part indicating said at least one of character, pattern and symbol of the translucent panel, wherein
the first region being provided to surround the second region, and
the second region is a belt-like region including a section of the diffusion sheet, which directly faces the light emitting diode, closer to a center of the part indicating said at least one of character, pattern and symbol with respect to a virtual pyramid defined by line segments connecting the outer peripheral portions of the part indicating said at least one of character, pattern and symbol and the light emitting diode to each other.

3. The electronic device of claim 2, wherein in the second region, a degree of cloudiness increases towards a central portion of the second region.

4. An electronic device comprising:
a housing; and
a touch sensor mounted in a part of the housing, wherein the touch sensor further comprising:
a translucent panel including a part indicating at least one of character, pattern and symbol;
a printed circuit board which senses activity on the translucent panel, the printed circuit board including a light emitting diode directly opposite the part indicating said at least one of character, pattern and symbol; and
a diffusion sheet provided between the translucent panel and the light emitting diode and diffusing light irradiated from the light emitting diode, the diffusion sheet comprises a first region and a second region, wherein the first region being transparent and surrounding the second region; and the second region to diffuse the light towards an outer peripheral portion of the part indicating said at least one of character, pattern and symbol of the translucent panel, the second region provided at a section of the diffusion sheet directly facing the light emitting diode and being situated toward a center of the part indicating said at least one of character, pattern and symbol so that light obliquely irradiated from the light emitting diode is not subjected to diffusion by the second region.

* * * * *